US008983660B1

(12) United States Patent
Hanfling

(10) Patent No.: US 8,983,660 B1
(45) Date of Patent: Mar. 17, 2015

(54) SUBSTRATE TRANSPORTER

(71) Applicant: KLA-Tencor Corporation, Milpitas, CA (US)

(72) Inventor: Yoram Hanfling, Pardes Hana Karkur (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/632,539

(22) Filed: Oct. 1, 2012

(51) Int. Cl.
*B25J 9/00* (2006.01)
*B25J 11/00* (2006.01)
*B25J 9/16* (2006.01)

(52) U.S. Cl.
CPC .............. *B25J 11/0095* (2013.01); *B25J 9/00* (2013.01); *B25J 9/1638* (2013.01); *B25J 9/1641* (2013.01)
USPC .......................................... 700/254

(58) Field of Classification Search
CPC .. B25J 9/1638; B25J 9/1641; H02K 11/0068; H02K 11/0084; H02P 5/46; H02P 5/48; H02P 5/50; H02P 5/52; H02P 5/68; H02P 5/74; H02P 6/00; H02P 6/003; H02P 6/007; H02P 6/04; H02P 6/10; H02P 6/16; H02P 6/183; H02P 6/185; H02P 7/00; H02P 7/0094; H02P 7/245; H02P 7/2805; H02P 7/29; H02P 7/2913; H02P 11/00; H02P 11/04; H02P 11/06; H02P 21/00; H02P 21/0003; H02P 21/0021; H02P 21/0039; H02P 21/0042; H02P 21/0085; H02P 21/06; H02P 21/08; H02P 21/10; H02P 21/12; H02P 23/00; H02P 23/0004; H02P 23/0027; H02P 23/0077; H02P 23/0086; H02P 23/04; H02P 2005/00; H02P 2005/002; H02P 2005/008; H02P 2006/00; H02P 2006/04; H02P 2007/00; H02P 2007/0011; H02P 2007/0077; H02P 2007/067; H02P 2007/074; H02P 2021/00; H02P 2021/0003; H02P 2021/0028; H02P 2021/0071; H02P 2203/00; H02P 2203/03; H02P 2203/05; H02P 2209/00
USPC ........... 310/12.33; 318/560, 568.22; 388/800, 388/801, 809, 825, 826, 828, 842, 843, 844, 388/848, 849; 901/9, 20
See application file for complete search history.

(56) References Cited

U.S. PATENT DOCUMENTS 5,799,543 A * 9/1998 Nagai et al. ................. 74/490.09

OTHER PUBLICATIONS

Aribowo, Wisnu et al. 'Vibration Control of Semiconductor Wafer Transfer Robot by Building an Integrated Tool of Parameter Identification and Input Shaping', Preprints of the 18th IFAC World Congress Milano (Italy) Aug. 28-Sep. 2, 2011, pp. 14367-14373.*

*Primary Examiner* — Saul Rodriguez
*Assistant Examiner* — Brendan Tighe
(74) *Attorney, Agent, or Firm* — Joshua D. Isenberg; JDI Patent

(57) ABSTRACT

Aspects of the present disclosure describe a robot which has a controller, actuators, encoders, and mechanical components. The robot may produce motion about an X, Z, $R_U$, $R_L$, and Theta axes. Movements of the robot are controlled by the controller. The repeatability of the robot is improved by designing the robot such that a control cycle frequency of the controller is 50 times or more greater than a vibrational frequency of one or more of the mechanical components. In order to reduce the release of particulates, a baffled enclosure may be used. It is emphasized that this abstract is provided to comply with the rules requiring an abstract that will allow a searcher or other reader to quickly ascertain the subject matter of the technical disclosure. This abstract is submitted with the understanding that it will not be used to interpret or limit the scope or meaning of the claims.

27 Claims, 10 Drawing Sheets

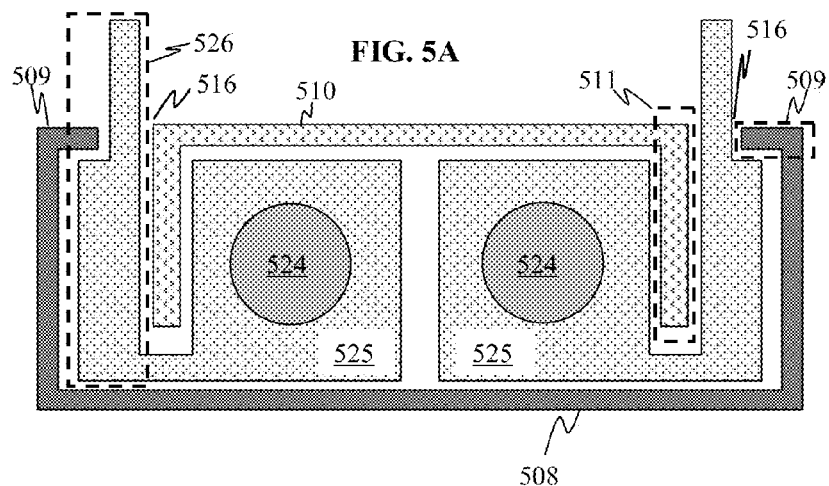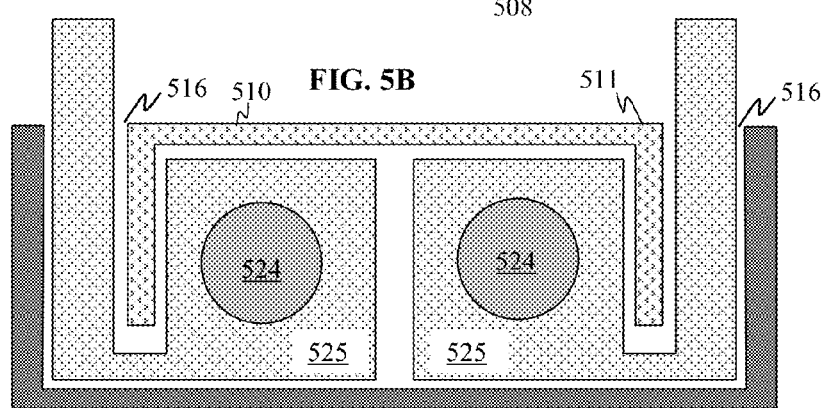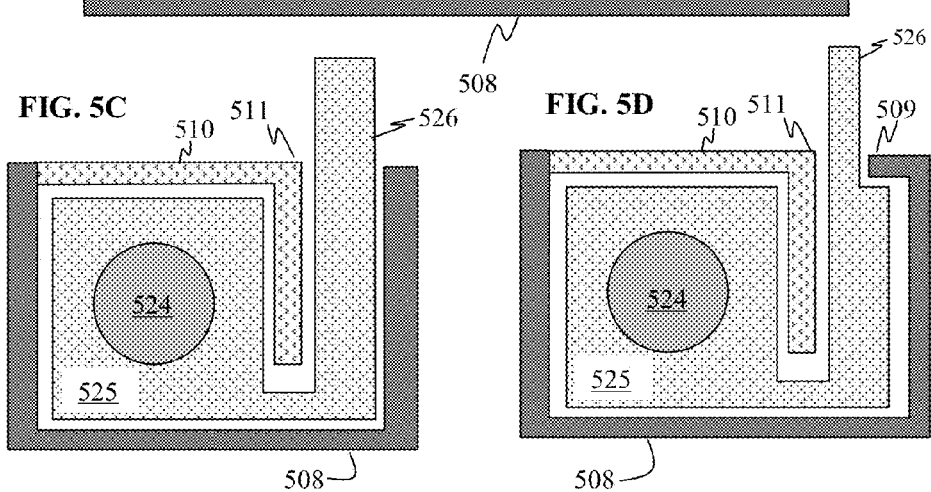

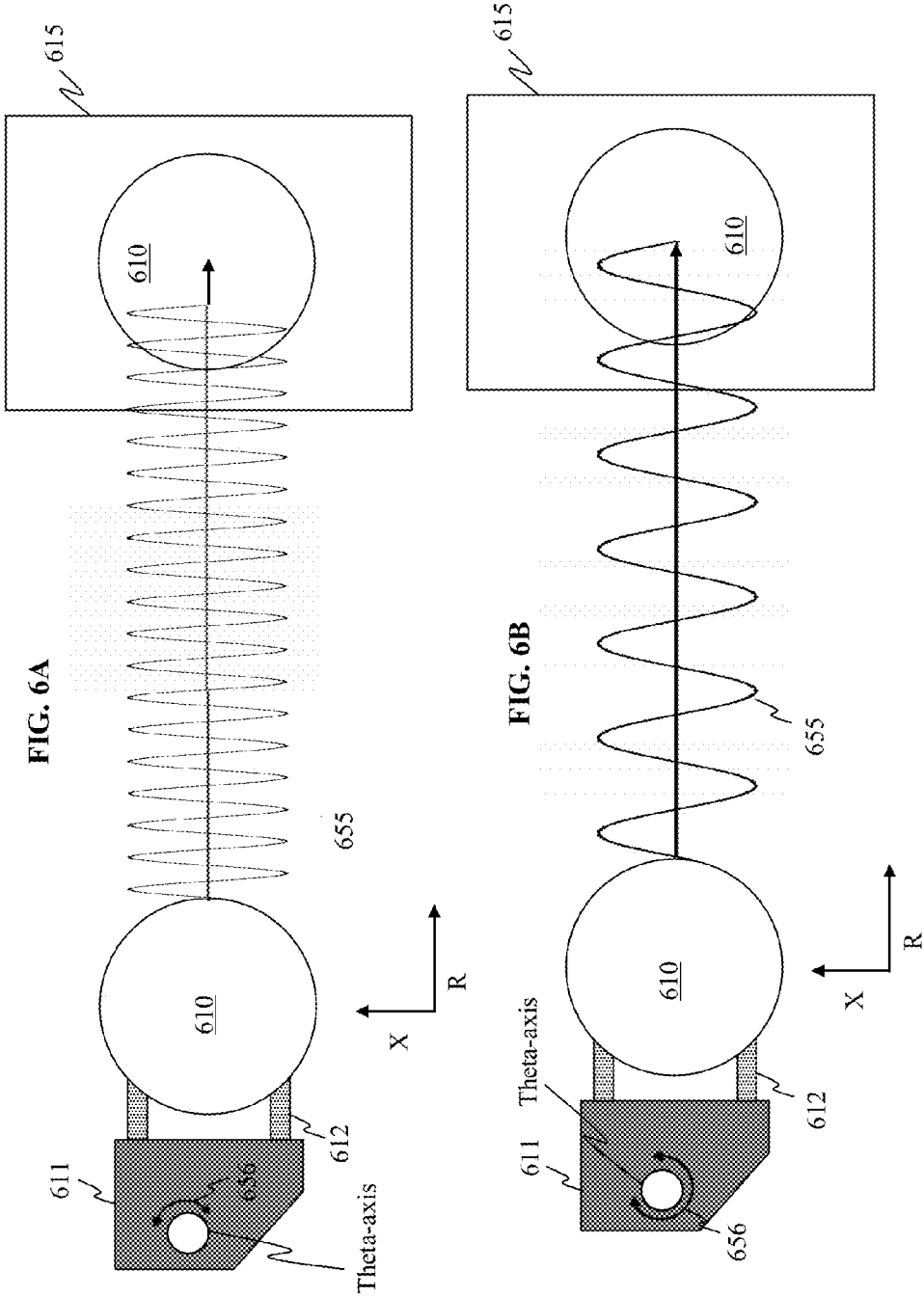

US 8,983,660 B1

SUBSTRATE TRANSPORTER

FIELD OF THE INVENTION

Aspects of the present disclosure relate to a substrate transporter. More specifically aspects of the present disclosure are related to a 5 axis XYZ-Theta robot for substrate transportation

BACKGROUND OF THE INVENTION

A substrate transporter must be highly efficient while producing minimal contamination to the cleanroom environment. With regard to efficiency, both the throughput and the repeatability must be taken into consideration. For a substrate transporter, throughput may be determined by the swap time, and the time it takes the transporter to move a substrate between a container, e.g., a front opening universal pod (FOUP), a pre-aligner, and a chuck. Additionally, minimizing the release of particulates produced by the transporter into an equipment front end module (EFEM) is an important concern in many applications.

Recently, substrate transporters have been made from selective compliant articulated robot arms (SCARAs). The SCARA design provides a sealed enclosure for the moving portions of the robot in order to minimize the potential for contamination. However, while SCARAs do reduce the release of particulates, there are also drawbacks to the use of SCARAs. First, SCARAs are slow at moving substrates. The slow speed is partially due to the need to perform complex calculations in order to properly position the end effector. In order to complete a task, a SCARA must first compute a motion plan. Thereafter, the SCARA must use inverse kinematics to transform the motion plan into joint actuator trajectories for the robot.

Additionally, even when a SCARA is equipped with two end effectors, the swap times are still slow. FIGS. 1A-D are overhead views of a double end effector robot swapping a pair of substrates $110_A$ and $110_B$ at a chuck 115 according to the prior art. End effectors $112_A$ and $112_B$ are configured such that they are attached to a single arm of a substrate transporter. FIG. 1A depicts the upper end effector $112_A$ retrieving a substrate $110_A$ from a chuck 115. The lower end effector $112_B$ is positioned below and oriented 90° away from the upper end effector $112_A$. This positioning is required in order to allow the upper end effector to freely access the first substrate $110_A$. The arrow indicates the direction of motion of both of the end effectors $112_A$ and $112_B$. At FIG. 1B, the upper end effector $112_A$ has picked up the first substrate $110_A$ and the robot arm begins to remove the substrate $110_A$ by retracting as indicated by the arrow. Once the upper end effector $112_A$ has sufficient clearance, the end effectors $112_A$ and $112_B$ reverse their orientation to each other. FIG. 1C depicts the switched orientation that now allows the lower end effector $112_B$ to have clear access to the chuck 115. Once reoriented, both end effectors are moved toward the chuck as indicated by the arrow. Finally, at FIG. 1D, the second substrate $110_B$ has been positioned on the chuck 115, and the robot arm may retract the end effectors $112_A$ and $112_B$ so they are both clear from the chuck as shown by the arrow. As shown, this process contains wasted movement. The robot arm must insert and retract the end effectors $112_A$ and $112_B$ twice in order to swap the pair of substrates $110_A$ and $110_B$.

SCARAs also have limited repeatability. SCARAs typically are limited to a repeatability of around 200 μm. It is widely known in the industry that the vibrational motion in SCARAs is a major limiting factor to the repeatability. This problem has increased in importance as the size of substrates has grown. Larger substrates, such as 300 mm and 450 mm substrates, result in longer arms for the substrate transporters and therefore more vibrations. As substrates continue to increase in size, problems with repeatability will continue to grow as well. Designs directed at reducing the vibrational motion often rely on increasing the stiffness of the structural materials. However stiffer materials are more expensive and increase the overall cost of production. Additionally, stiffening the structure by adding mass will result in more vibrations.

Therefore, there is a need in the art for a highly repeatable substrate transporter, with a reduced swap time. Further there is a need in the art for a substrate transporter that is highly efficient while still minimizing the release of particulates into the environment.

BRIEF DESCRIPTION OF THE DRAWINGS

Other objects and advantages of the invention will become apparent upon reading the following detailed description and upon reference to the accompanying drawings in which:

FIGS. 5A-5D are cross sectional views of enclosures and the slots where the movement arm exits the enclosure according to various aspects of the present disclosure.

FIG. 6A is an overhead view of an end effector placing a substrate on a chuck with the effects of vibration in the end effector exaggerated according to the prior art.

FIG. 6B is an overhead view of an end effector placing a substrate on a chuck with the effects of vibration in the end effector exaggerated according to aspects of the present disclosure.

DESCRIPTION OF THE SPECIFIC EMBODIMENTS

Figure 1A:
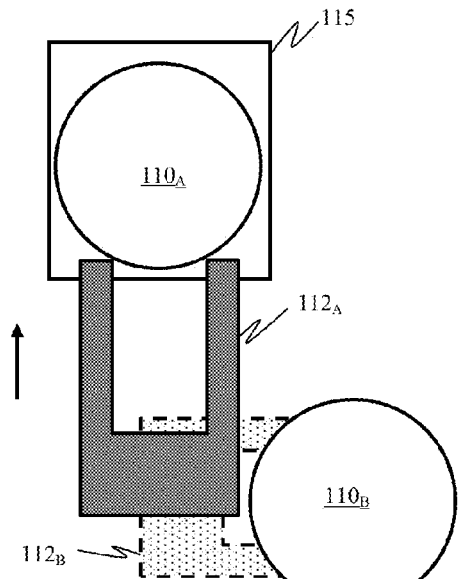
FIGS. 1A-D are a series of overhead views of a substrate transporter with two end effectors swapping a substrate at a chuck according to the prior art.
Figure 1B:
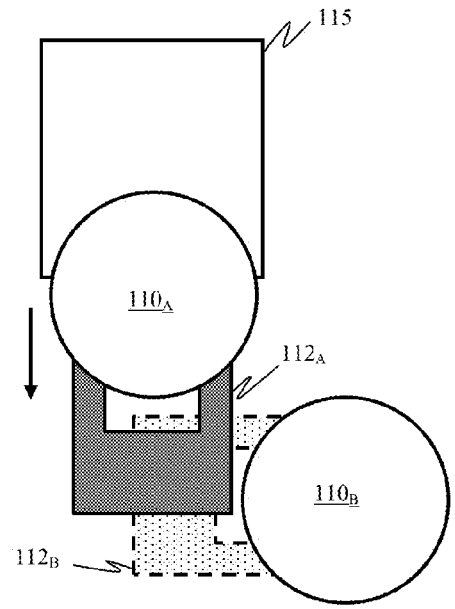
Figure 1C:
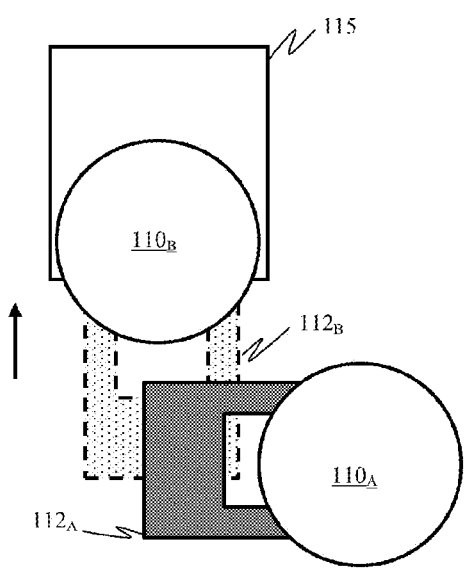
Figure 1D:
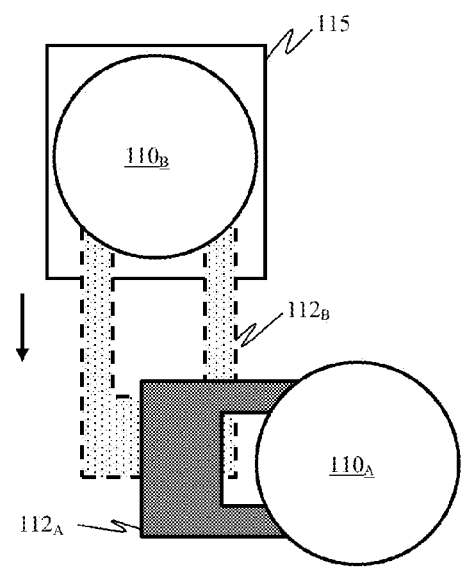

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following description, reference is made to the accompanying drawings, which form a part hereof, and in which is shown by way of illustration specific embodiments in which embodiments of the invention may be practiced. In this regard, directional terminology, such as "top," "bottom," "front," "back," "leading," "trailing," etc., is sometimes used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Aspects of the present disclosure describe a substrate transporter with improved repeatability and a decreased swap time, while minimizing the release of particulates. Over the course of the development of various aspects of the present disclosure, it was discovered that repeatability may be improved by utilizing structures with a relatively low stiffness and correspondingly low natural frequency of vibration. This was quite unexpected as the prevailing approach to repeatability in robot motion is to utilize structures characterized by a high stiffness and a correspondingly high natural frequency of vibration. By utilizing a robot structure with relatively low stiffness, the frequency of the vibrations within the substrate transporter is reduced. When vibrations induced by disturbances, such as initiating and ceasing motion, are in phase and at a low frequency, high repeatability is achievable. It was found that despite effects of hysteresis and friction, the vibrations within the substrate transporter have a high repeatability. Even though the encoders used to track the motion of the substrate transporter are not able to detect the vibrational motion and account for its effects, high repeatability is achievable when the frequency of the control cycle of the controller is approximately 50 or more times higher than the frequency of the vibrations.

Additional aspects of the present disclosure are directed at improving the throughput of a substrate transporter. The use of a linear axis design minimizes the complex motions needed when using a SCARA. The reduction in complexity allows for an increase in the speed at which substrates are moved between the FOUP, the pre-aligner, and the machine chuck. Further, aspects of the present disclosure describe narrow slots, baffles, and suction along the linear paths to allow motion, while at the same time minimizing the release of particulates generated by the substrate transporter. By incorporating aspects of the present disclosure directed at reducing particulate generation, a linear axis design is now possible when previously it was not thought possible due to their perceived increase in the release of particulates.

Additional aspects of the present disclosure are directed at a transporter comprised of two independently controlled end effectors positioned on parallel axes. This orientation reduces the motion required to swap a substrate at the chuck, the pre-aligner, or the FOUP. The two end effectors go into the tool together. First, the end effector traveling on an $R_L$ axis may go under the substrate on the chuck. The end effector traveling on an $R_U$ axis is holding the substrate that will be swapped onto the chuck. Next, the end effector traveling on the $R_L$ axis picks up the substrate on the chuck and retracts. Finally, the end effector traveling on the $R_U$ axis puts the substrate it is holding on the chuck and then retracts. Through this swapping method, the transporter is no longer required to enter and exit the tool two times to make a switch as described in the prior art. Therefore, the swapping time may be substantially reduced.

It should be noted that applications of aspects of the present disclosure are not limited to substrate transport robots. While certain aspects of the present disclosure are highly advantages for use in a clean room environment, the present disclosure is not so limited. Any application that requires highly repeatable robotic motion may utilizes one or more of the aspects of the present disclosure. By way of example, and not by way of limitation, assembly line robots may utilize aspects of the present disclosure for applications such as precision welding. As used herein, the terms "substrate transporter", "robot", and "apparatus" may be used interchangeably.

Figure 2A:
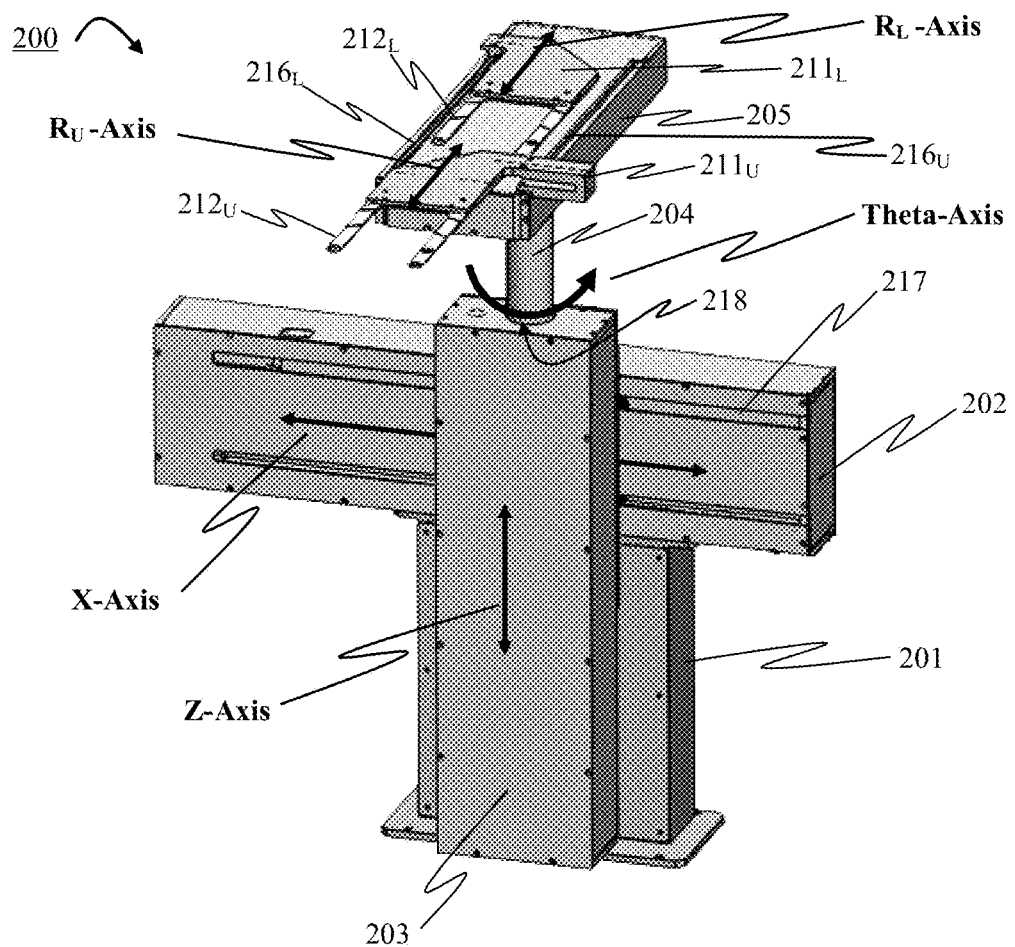
FIG. 2A is a diagram of a substrate transporter according to an aspect of the present disclosure.

FIG. 2A is a diagram of a substrate transporter 200 according to aspects of the present disclosure. The substrate transporter 200 may be capable of movement about one or more axes. By way of example and not by way of limitation, substrate transporter 200 is capable of movement about X, Z, $R_L$, $R_U$ and Theta axes. The components that generate the movement along the axes may be housed within one or more substantially sealed enclosures. By way of example and not by way of limitation, substrate transporter 200 may have three enclosures and a shaft which substantially enclose the components of the robot. Substantially sealed means that the only unsealed portions of the enclosure are narrow slots or through holes that accommodate connection between mechanical components inside the enclosure and a moving element (e.g., an end effector or another axis) outside the enclosure.

The X-axis may be enclosed with enclosure 202. Movement along the X-axis is allowed by using narrow slots 217. Substrate transporter 200 may contain two slots along the X-axis, but additional aspects of the present disclosure are not so limited. By way of example, it may be desirable to use one slot, or two or more slots depending on the specific application the robot is being used for. Specifically, if the weight supported by the mechanical components exiting through the slots is high, then more slots may be used to support the additional weight. The Z-axis may be substantially enclosed by enclosure 203. Movement along the Z-axis is allowed by extending a shaft 204 through a through hole 218 in the enclosure 203. The Theta-axis may be substantially enclosed by the shaft 204. Shaft 204 may be a hollow shaft. Movement about the Theta-axis is produced by rotating shaft 204 about the Z-axis. The $R_L$ and $R_U$ axes may be enclosed by enclosure 205. Movement along the $R_L$ axis is produced by allowing a mechanical component to exit through a narrow slot $216_L$. Substrate transporter 200 may contain one slot along the $R_L$-axis, but additional aspects of the present disclosure are not so limited. By way of example, it may be desirable to use one slot, or two or more slots depending on the specific application the robot is being used for. Movement along the $R_U$ axis is produced by allowing a mechanical component to exit through a narrow slot $216_U$. Substrate transporter 200 may contain one slot along the Ru-axis, but additional aspects of the present disclosure are not so limited. By way of example, it may be desirable to use one slot, or two or more slots depending on the specific application the robot is being used for.

Movement along the X, Z, $R_U$, $R_L$, and Theta axes may be generated through the use of an actuator 221 and mechanical components 222. By way of example, and not by way of limitation, the actuator 221 may be an electric rotary motor, a linear motor, a hydraulic piston, or a pneumatic piston. The actuators 221 are controlled by a controller 206. Additionally, each axis may also include an encoder 223. The encoder 223 tracks the movement of the actuator 221 and provides the position information back to the controller 206 to form a feedback loop. The mechanical components 222 of each of the linear axes (X, Z, $R_U$, and $R_L$) may be comprised of a linear slide and a lead screw. The mechanical components 222 of the Theta-axis may be comprised of ball bearings and a gear. Additionally, the Theta-axis may further comprise a mechanical stop to prevent the substrate transporter from over-rotating about the Theta-axis and in order to improve repeatability.

Figure 2B:
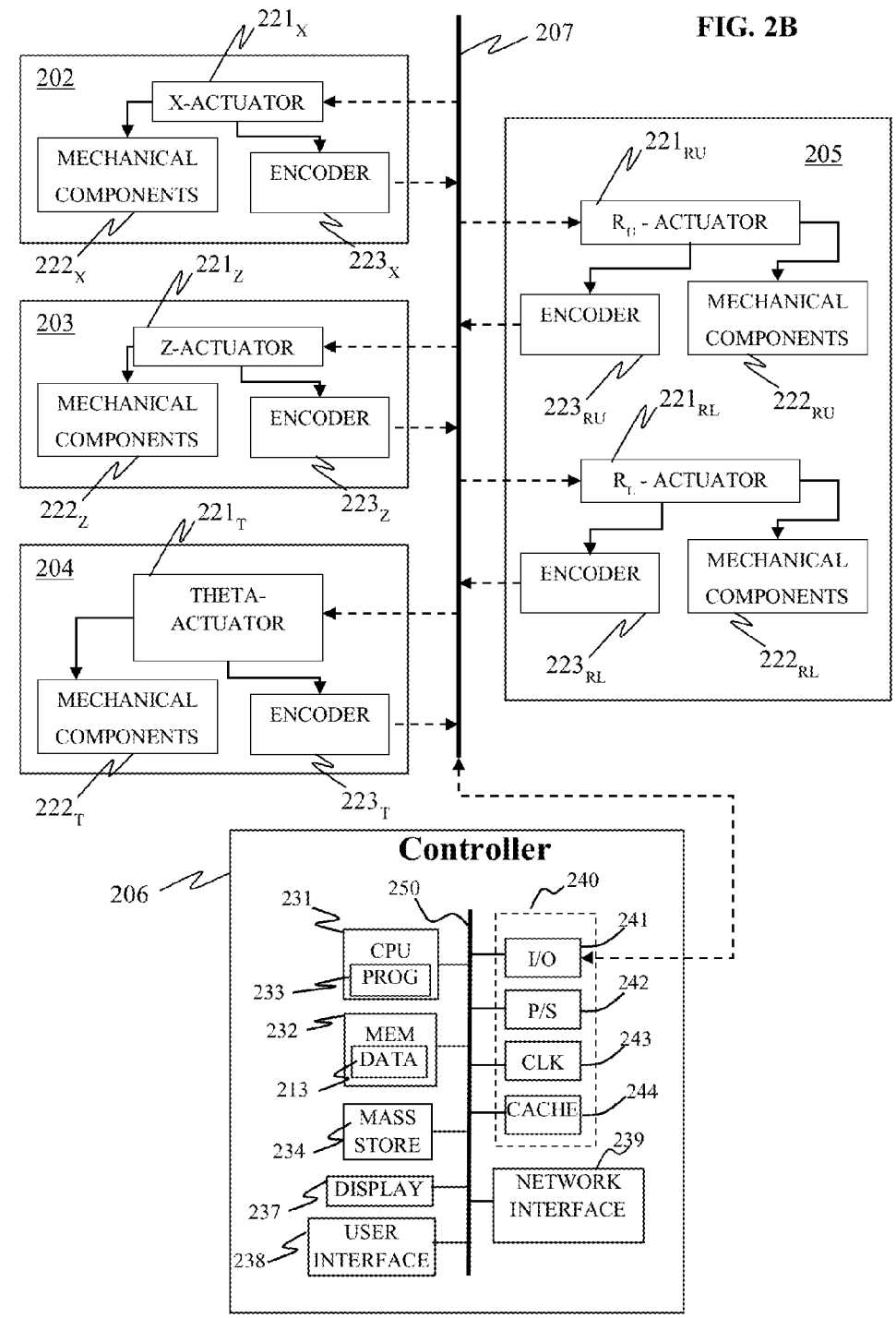
FIG. 2B is a block diagram of the substrate transporter according to an aspect of the present disclosure.

FIG. 2B is a schematic diagram of the substrate transporter 200. The controller 206 may communicate with each of the actuators 221 and each of the encoders 223 through a data bus 207. The controller may be located within one of the one or more enclosures of the substrate transporter 200 or it may be located in the support enclosure 201. Additionally, the controller may be located at an external site and may gain access to the data bus 207 over a network via a network interface 239.

The controller 206 may include a central processor unit (CPU) 231. By way of example, a CPU 231 may include one or more processors, which may be configured according to, e.g., a dual-core, quad-core, multi-core, or Cell processor architecture. The controller 206 may also include a memory 232 (e.g., RAM, DRAM, ROM, and the like). The CPU 231 may execute a process-control program 233, portions of which may be stored in the memory 232. The controller 206 may also include well-known support circuits 240, such as input/output (I/O) circuits 241, power supplies (P/S) 242, a clock (CLK) 243 and cache 244. The controller 206 may optionally include a mass storage device 234 such as a disk drive, CD-ROM drive, tape drive, or the like to store programs and/or data. The controller 206 may also optionally include a display unit 237. The display unit 237 may be in the form of a cathode ray tube (CRT) or flat panel screen that displays text, numerals, or graphical symbols. The controller 206 may include a network interface 239, configured to enable the use of Wi-Fi, an Ethernet port, or other communication methods.

The network interface 239 may incorporate suitable hardware, software, firmware or some combination of two or more of these to facilitate communication via an electronic communications network. The network interface 239 may be configured to implement wired or wireless communication over local area networks and wide area networks such as the Internet. The controller 206 may send and receive data and/or requests for files via one or more data packets over a network.

The preceding components may exchange signals with each other via an internal system bus 250. The controller 206 may be a general purpose computer that becomes a special purpose computer when running code that implements embodiments of the present invention as described herein.

Figure 3A:
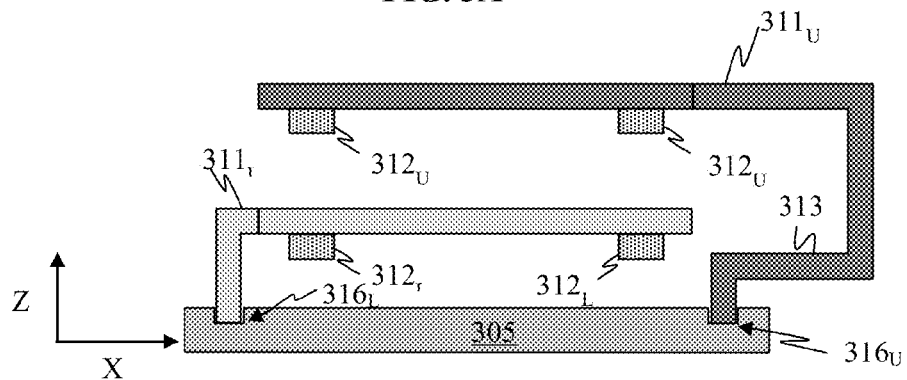
FIG. 3A is a cross-sectional view of a substrate transporter with two end effectors according to an aspect of the present disclosure.
Figure 3B:
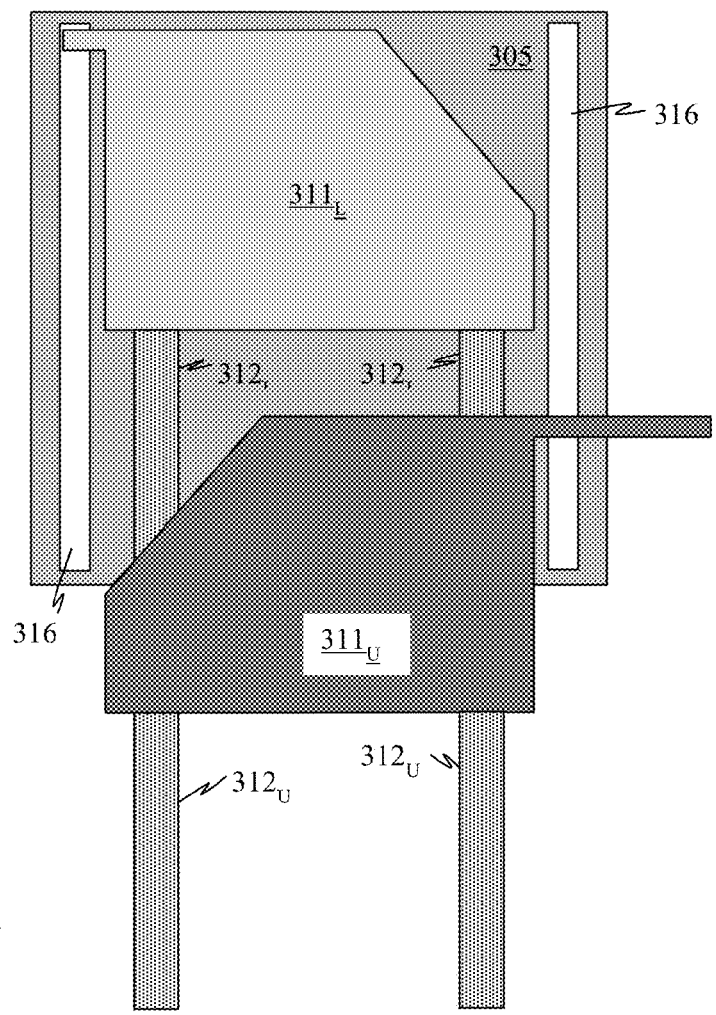
FIG. 3B is an overhead view of a substrate transporter with two end effectors according to an aspect of the present disclosure.

In order to minimize the time it takes to swap a substrate from a chuck, aspects of the present disclosure are directed at an end effector configuration. The end effector configuration of the present disclosure may include a two end effector apparatus in which each end effector may move independently in the R direction. FIG. 3A is a cross section view of the end effector configuration viewed in the X-Z plane. FIG. 3B is an overhead view of the end effector configuration viewed in the X-R plane. As can be seen from the two views, the $R_L$, and the $R_U$ axes run parallel to each other, and are offset in the Z direction. The offset in the Z direction should be large enough to allow for the end effectors $312_U$ and $312_L$ to support a substrate and move back and forth along its respective R axis without being interrupted by the other end effector 312.

Each of the end effectors $312_U$ and $312_L$ are connected to their own support structures $311_U$ and $311_L$. The upper support structure $311_U$ may optionally have an extended portion 313. This extension 313 is beneficial when the substrate being moved is wide and extends beyond the width of the end effectors 312 in the X direction. With the extra clearance in the X-axis, larger substrates may be moved without support structure $311_U$ interfering with the movement. In order to allow for independent movement, each of the support structures 311 are connected to a mechanical component 222 within the enclosure 305 through a unique slot $316_U$ or $316_L$. The narrow slots 316 form a double baffle and will be discussed in greater detail below.

This configuration of the end effectors $312_U$ and $312_L$ allows for more efficient swapping of substrates at a tool's chuck and at a pre-aligner. FIGS. 4A-4F depict the process of swapping out a substrate according to embodiments of the present disclosure. Initially at FIG. 4A, the substrate transporter is supporting a substrate $410_B$ with the upper end effector $412_U$. The substrate $410_A$ may be positioned on a chuck 415 inside a tool 417. The chuck 415 may be shaped such that the end effectors $412_U$ and $412_L$ to pass through the chuck 415 in the Z or R direction while still being able to support the substrates $410_A$ and $410_B$. By way of example, and not by way of limitation tool 417 may be a metrology tool, an inspection tool, or a review tool.

Examples of metrology tools include, but are not limited to overlay tools, interferometers, critical dimension (CD) tools (e.g., CD scanning electron microscope (CD-SEM)), film thickness tools, ion implant metrology tools, surface profiling tools, resistivity metrology tools, reticle pattern placement metrology tools, edge metrology tools, reflectometers, and ellipsometers.

Specific examples of commercially available overlay metrology tools include the Archer series overlay tools from KLA-Tencor Corporation of Milpitas, Calif.

Examples of optical CD metrology tools include SpectraShape optical CD tools from KLA-Tencor Corporation of Milpitas, Calif.

Examples of optical film thickness/refractive index/stress metrology tools include Aleris family, ASET-F5x, and SpectraFx tools from KLA-Tencor Corporation of Milpitas, Calif.

Examples of metrology tools for measuring wafer geometry and topography include WaferSight tools from KLA-Tencor Corporation of Milpitas, Calif. In addition, the SURFmonitor module for Surfscan SPx series tools from KLA-Tencor can indicate sub-angstrom surface topography variation on blanket films and bare substrates.

Examples of ion implant metrology tools include ThermaProbe tools from KLA-Tencor Corporation of Milpitas, Calif.

Examples of surface profiling metrology tools include HRP-x50 automated stylus-based surface profilers from KLA-Tencor Corporation of Milpitas, Calif.

Examples of resistivity metrology tools include RS-x00 sheet resistance mapping tools from KLA-Tencor Corporation of Milpitas, Calif.

Examples of reticle pattern placement metrology tools include IPRO Series tools from KLA-Tencor Corporation of Milpitas, Calif.

Examples of edge metrology tools include VisEdge Family tools from KLA-Tencor Corporation of Milpitas, Calif.

Examples of inspection tools include, but are not limited to optical and electron beam wafer inspection systems for patterned or unpatterned wafers, macro defect inspection tools, edge defect inspection tools, infrared inspection tools, and reticle inspection tools.

Specific examples of commercially available inspection tools include, but are not limited to the following.

Optical wafer inspection tools for patterned wafers include 28XX series and 29XX series broadband optical defect inspection tools and Puma series laser-based optical defect inspection tools and the 8900 high-speed brightfield/darkfield optical defect inspection system; all of which are available from KLA-Tencor Corporation of Milpitas, Calif.

Electron beam wafer inspection tools for patterned wafers include the eS800 electron beam defect inspection system from KLA-Tencor Corporation of Milpitas, Calif.

Optical wafer inspection tools for unpatterned wafers include the Surfscan SPx and series and SURFmonitor (SURFmonitor is an option on an SPx tool) wafer defect inspection tools from KLA-Tencor Corporation of Milpitas, Calif.

Examples of edge defect inspection tools include VisEdge family tools from KLA-Tencor Corporation of Milpitas, Calif.

Examples of macro defect inspection tools include LDS infrared defect inspection tools and review station from KLA-Tencor Corporation of Milpitas, Calif.

Examples of infrared defect inspection tools include IRIS infrared defect inspection tools and review station from KLA-Tencor Corporation of Milpitas, Calif.

Examples of reticle inspection tools include TeraFab series Photomask inspection tools from KLA-Tencor Corporation of Milpitas, Calif.

Examples of review tools include electron beam, optical, or infrared review tools. Examples of electron beam review tools include the eDR-7000 series SEM-based defect review and classification systems from KLA-Tencor Corporation of Milpitas, Calif. Examples of optical review tools include INX-3×00 series automated, full-spectrum optical review systems from KLA-Tencor Corporation of Milpitas, Calif. Examples of infrared review tools include the IRIS infrared inspection and review station from KLA-Tencor Corporation of Milpitas, Calif.

In addition to metrology and inspection tools, a robotic substrate transporter as described herein may be used in conjunction with, or incorporated into a substrate processing tool with a single wafer loading. Examples of substrate processing tools include etch tools, deposition tools, and the like.

At this point, neither the lower nor the upper end effectors have moved in the R-direction towards the tool 417. At FIG. 4B, both the lower and upper end effectors $412_U$ and $412_L$ are moved into the tool 417 as indicated by the arrow. At this point, the lower end effector $412_L$ is positioned below the substrate $410_A$. Next at FIG. 4C, both of the end effectors $412_U$ and $412_L$ are raised in the Z-direction as indicated by the arrow until the lower end effector $412_L$ begins to support the substrate $410_A$. Each of the end effectors $412_U$ and $412_L$ may also be equipped with suction in order to improve the contact with the substrates $410_A$ and $410_B$.

Figure 4A:
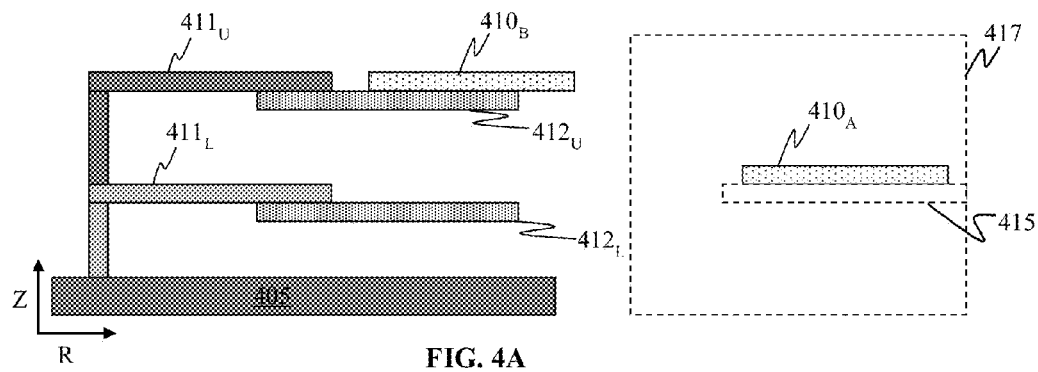
FIGS. 4A-4F are side views of a pair of end effectors swapping a substrate at a tool according to an aspect of the present disclosure.
Figure 4B:
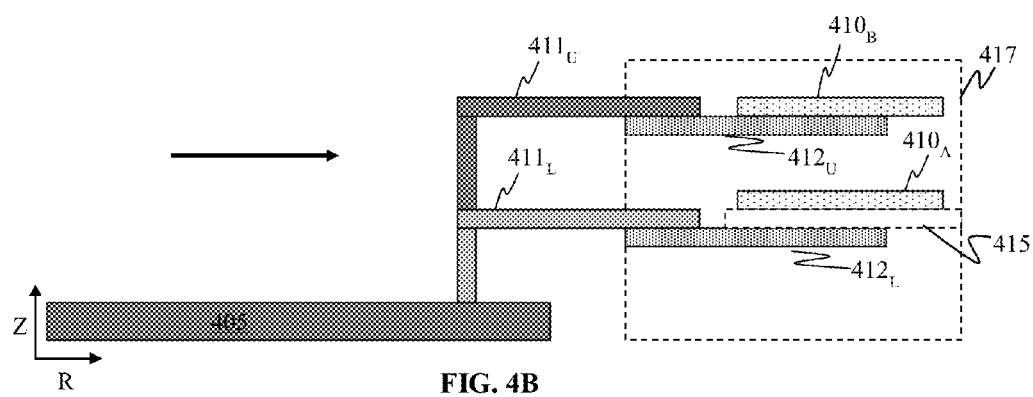
Figure 4C:
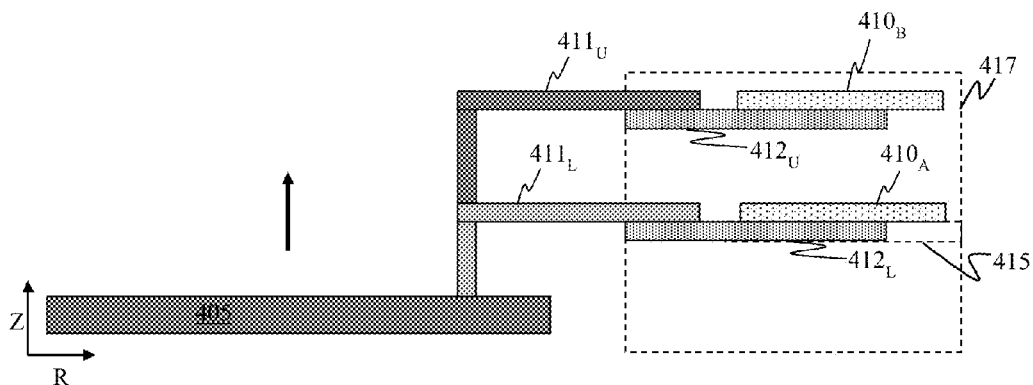
Figure 4D:
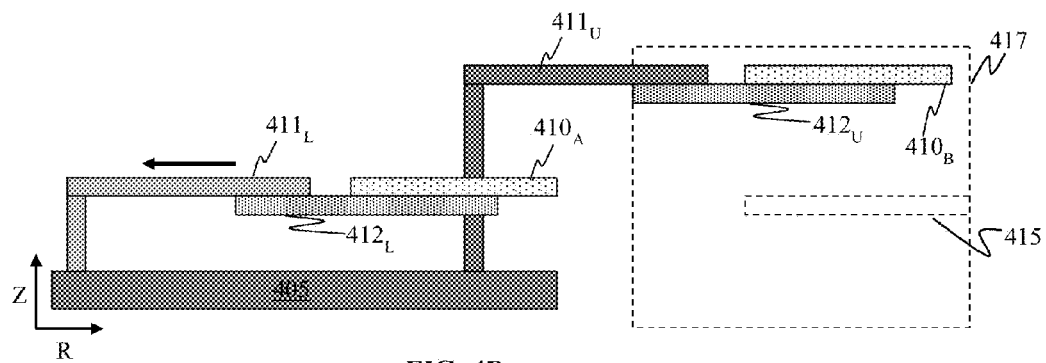
Figure 4E:
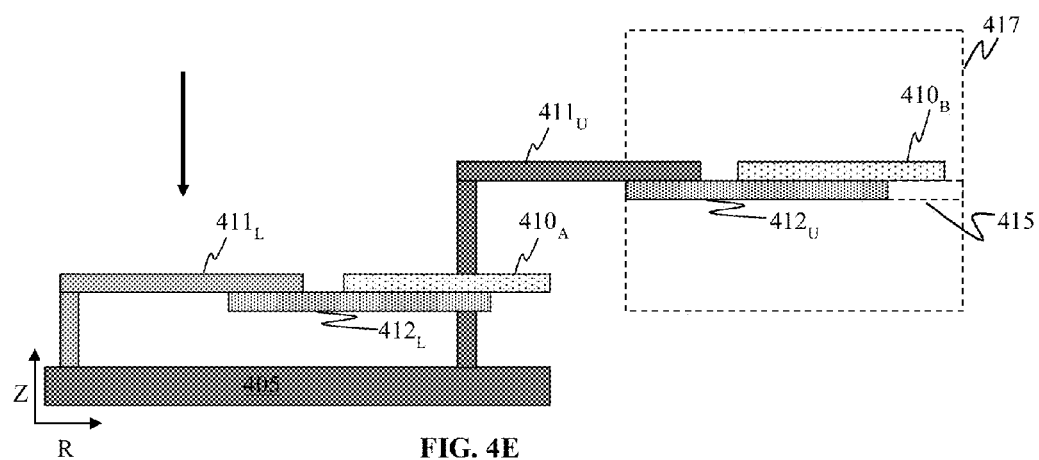
Figure 4F:
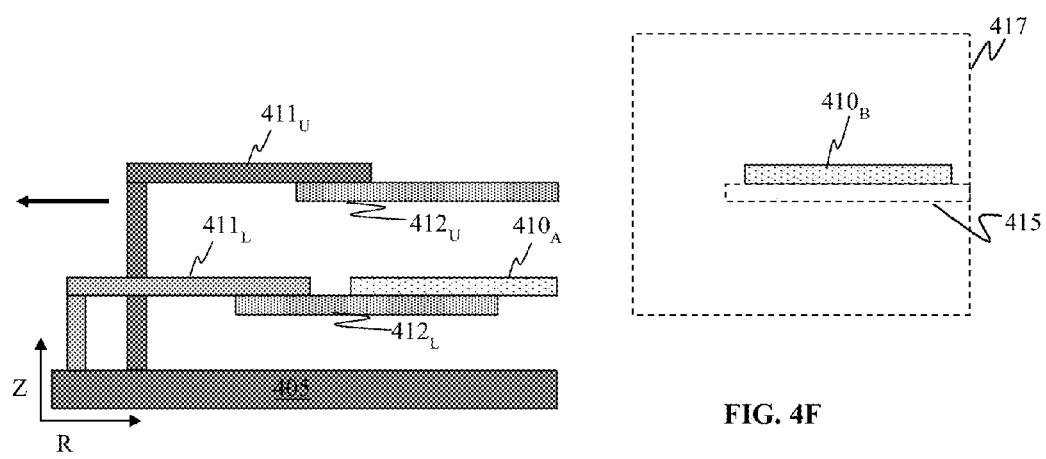

Once the lower end effector $412_L$ has begun supporting the substrate $410_A$, the lower end effector is retracted backwards along the $R_L$-axis, as shown by the arrow in FIG. 4D. The end effector $412_L$ and the substrate $410_A$ are retracted until both are clear from the tool 417. Once both are clear from the tool 417, both end effectors $412_U$ and $412_L$ are lowered along the Z-axis, as shown by the arrow in FIG. 4E. The end effectors $412_U$ and $412_L$ are lowered until the substrate $410_E$ is supported by the chuck 415. Once the chuck 415 begins supporting the substrate $410_E$ the upper end effector $412_U$ may be retracted along the Ru-axis as shown by the arrow in FIG. 4F.

The same swapping procedure described in FIGS. 4A-4F may also be used when swapping a pair of substrates at a pre-aligner or at the FOUP.

Figure 8A:
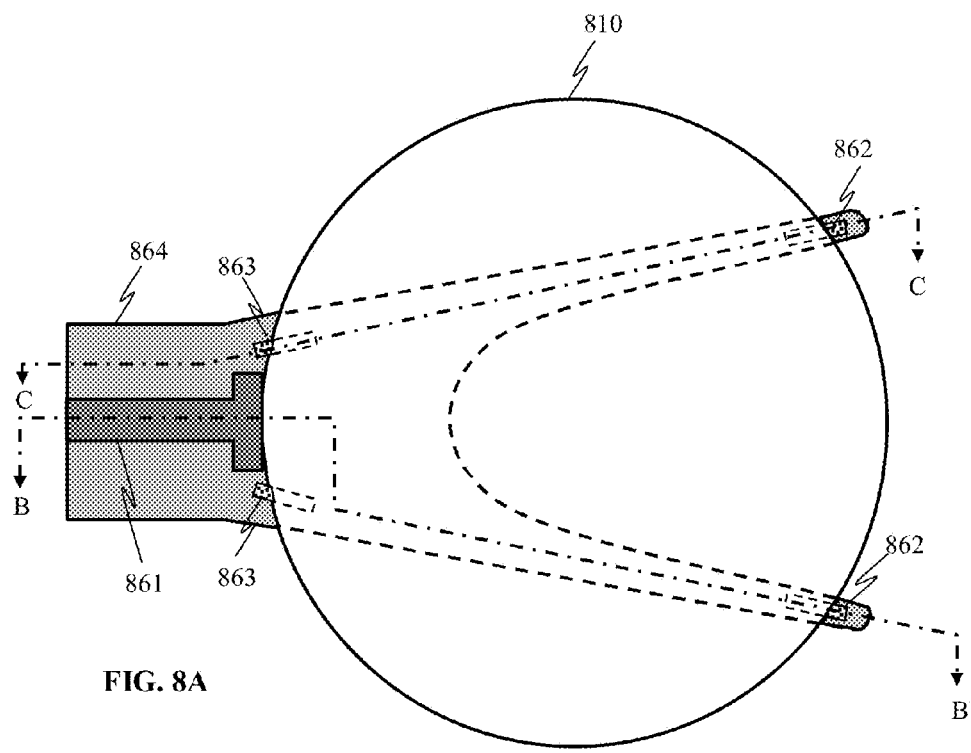
FIGS. 8A-8C are overhead and cross sectional views of an end effector that is configured to grip a substrate along the edge of the substrate.
Figure 8B:
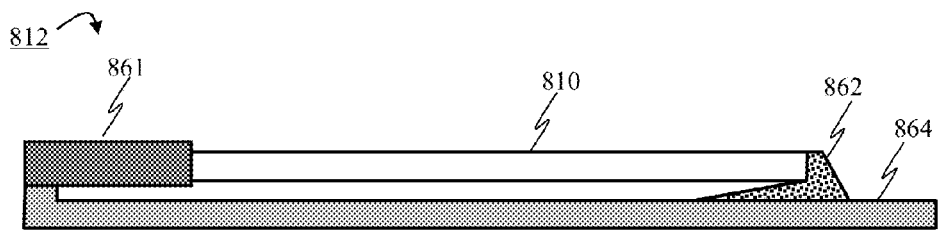
Figure 8C:
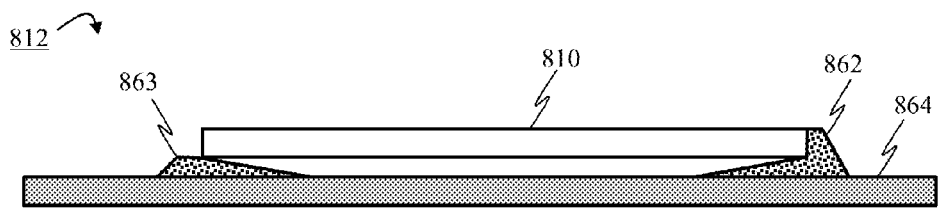

According to aspects of the present disclosure, the end effectors $412_U$ and $412_L$ may also support the substrates through the use of an edge grip design depicted in FIGS. 8A-8C. This edge grip configuration is beneficial for the transportation of substrates because it reduces contact with the backside of the substrate. By way of example, and not by way of limitation, a substrate may be a 450 mm wafer. The end effector 812 may comprise an actuator 861, two stoppers 862, and a frame 864. The stoppers 862 may be separate mechanical components that are attached to the frame 864, or they may be formed as a single component with the frame 864. By way of example, and not by way of limitation, the stoppers 862 may be made from a polymer material, such as Ertlite. The actuator 861 may be attached to the frame 812.

According to additional aspects of the present disclosure, the end effector 812 may further comprise one or more support pads 863. The support pads 863 may be separate mechanical components that are attached to the frame 864, or they may be formed as a single component with the frame 864. By way of example, and not by way of limitation, the support pads 863 may be made from a polymer material, such as Ertlite.

As shown in the overhead view of the edge grip configuration in FIG. 8A, the substrate 810 is contacted along the circumferential edge of the substrate by an actuator 861 and two stoppers 862 that prevent lateral movement of the substrate 810. The actuator 861 may apply pressure to the circumferential edge of substrate 810 in order to securely wedge the substrate 810 against the two stoppers 862. The weight of the substrate 810 is supported by the tangential contact of the stoppers 862. By way of example, and not by way of limitation, the actuator 861 may be an air cylinder. Additionally, one or more support pads 863 may provide additional support to the bottom surface of the substrate 810 proximate to the circumferential edge of the substrate 810.

FIG. 8B is a cross-sectional view of FIG. 8A along line B-B. The substrate 810 is shown being pinched between the actuator 861 and one of the stoppers 862 so that the backside of the wafer does not come into contact with the frame 864. The stopper 862 may have an elongated edge that allows the substrate 810 to be supported above the frame 864 if the actuator 861 has not yet begun to apply pressure to the circumferential edge of the substrate 810. The substrate 810 may remain in contact with the elongated edge even when the actuator 861 is applying pressure to the circumferential edge of the substrate 810.

FIG. 8C is a cross-sectional view of FIG. 8A along line C-C. A support pad 863 may be added to the end effector 812 in order to provide additional support to the substrate 810 and to prevent the backside of the substrate 810 from contacting the frame 864. In one particular implementation, the that these support pads 863 do not have a "grip" portion that applies a force to the edge of the substrate 810. Instead, the support pads 863 may be configured to provide support to the bottom surface of the substrate 810 and to ensure that the substrate does not contact the frame 864. In some implementations, there may be an exclusion zone at the edge of the substrate 810 where the support pads 863. For example, for semiconductor wafers, there may be a 1-mm exclusion zone at the wafer edge where the supports are allowed to touch.

In order to prevent particulates from contaminating the substrate or a clean environment, certain aspects of the present disclosure are directed at one or more baffles being added to the enclosures. The addition of baffles may be used on each of the slots present in the apparatus. FIG. 5A is a cross sectional view of the enclosure 205. Enclosure 205 may house the actuators, encoders, and mechanical components which produce the movement of the apparatus in the $R_U$ and $R_L$ axes. However, in interest of clarity, only some of the mechanical components 222 are shown in FIG. 5A. The mechanical components 222 shown are the lead screw 524 and the motion component 525 for each axis. As noted earlier, each set of mechanical components 222 may move independently of each other. The motion components 525 are moved along the $R_U$ and $R_T$ axes by a lead screw 524. However, it should be noted that alternatives to the lead screw 524 may be used. By way of example, and not by way of limitation, the lead screw 524 may be replaced with pneumatics, hydraulics, or gears.

The enclosure may be comprised of two or more pieces of material. By way of example, and not by way of limitation, enclosure 205 is comprised of an upper portion 510 and a lower portion 508. The lower portion of the enclosure 508 shields the bottom and sides of the mechanical components 222 from the external environment. The upper portion of the enclosure 510 shields the top side of the mechanical components 222. The two or more pieces of material that form the enclosure 205 are sized and shaped such that they form a slot 516 when they are attached to each other. The width of the slot should be narrow in order to prevent particulates from escaping from the robot. By way of example and not by way of limitation, the slots 516 in enclosure 205 may be less than 6.5 mm wide.

The portion of the motion component 525 which extends upwards through the slot 516 in the enclosure 205 is the movement arm 526. The movement arm 525 is surrounded by a dotted box in FIG. 5A. The movement arm 525 may be used as a support to attach one or more end effectors. Additionally, the movement arm may be attached to another portion of the robot. By way of example, the movement arms 526 extending out of the X-axis enclosure 202 may be attached to the Z-axis enclosure 203. The movement arm 526 may have a constant cross sectional area (as shown in FIG. 5B), or it may have a reduction in the cross sectional area (as shown in FIG. 5A). When the cross sectional area of the movement arm 526 is reduced, the bottom portion of the enclosure 508 may cover a portion of the top side of the mechanical components by forming a bottom baffle 509. The bottom baffle 509 is surrounded by a dotted box in FIG. 5A. While not necessary, reducing the cross sectional area of movement arm 526 below the slot exit is useful because it reduces the required width of the slot 516. This will help prevent particulates from exiting the apparatus during operation. The bottom baffle 509 also makes it harder for particulates to escape the robot because the bottom baffle 509 forms a corner that particulates must navigate around before exiting the enclosure 205. The upper portion of the enclosure 510 includes an upper baffle 511. The upper baffle 511 extends downwards into a gap between the movement arm 526 and the remainder of the motion component 525. By way of example, and not by way of limitation, the upper baffle may extend substantially all the way to the bottom of the gap, such that there is still a gap of one or less millimeters between the bottom of the upper baffle 511 and the motion component 525. Additionally the upper baffle 511 may extend downwards and fill only a portion of the gap between the movement arm 526 and the remainder of the motion component 525. The additional interior wall formed by the upper baffle 511 minimizes the amount of particulates which are released into the environment. In FIGS. 5A-5D, the upper baffles 511 are oriented 90 degrees from the rest of the upper portion of the enclosure 510. However, aspects of the disclosure should not be limited to this orientation. By way of example, and not by way of limitation, the upper baffle 511 may extend downwards at any angle that does not restrict the motion of the movement arm 526.

It should be noted that aspects of the present disclosure are not limited to enclosures with two independently controllable motion components 525. By way of example, FIGS. 5C and 5D depict cross sectional views of enclosures comprised of a single motion component 525. FIG. 5C depicts an enclosure where the movement arm 526 has a constant cross sectional area. The bottom portion of the enclosure 508 covers the sides and bottom of the mechanical components 222, and the upper portion of the enclosure 510 covers the top portion of the mechanical components 222. Similar to the aspects of the present disclosure with two motion components 525, the single motion component 525 variation also has an upper baffle 511.

FIG. 5D depicts an enclosure where the movement arm 525 has a reduced cross sectional area at the slot exit. The reduction in cross sectional area below the slot exit allows for the bottom portion of the enclosure to include a bottom baffle 509. The bottom baffle 509 provides additional protection to minimize the release of particulates.

According to additional aspects of the present disclosure, suction may also be applied to each enclosure. The addition of suction provides additional protection in preventing the release of particulates into the environment. Suction may be added to each enclosure by adding one or more fans in the support enclosure 201. The suction may be transmitted to the R-enclosure 205 through the hollow tube 204 forming the Z-enclosure. The exhaust from the fans may be routed out of the substrate transporter through the base of the support enclosure 201.

Substrate transporter robots require a high degree of repeatability. As mentioned previously, SCARA robots are typically repeatable to around 200 µm. Also, as the substrate size grows, vibrational motion has begun to make repeatability even harder to control. The errors due to vibrational motion are normally addressed by reducing the amplitude of the vibrations. This may be done by introducing stiffer materials or structures in the construction of the robot, or redesigning the robot to have an increased mass. Contrary to this standard practice, aspects of the present disclosure reduce the stiffness of certain components in order to decrease the vibrational frequency. More specifically, repeatability may be improved by decreasing the vibrational frequency within the Theta-axis.

The repeatability of a substrate transporter may be improved to approximately 60 µm when the frequency of the control cycle of the controller is 50 or more times greater than the vibrational frequency of the Theta-axis. By way of example and not by way of limitation, the vibrational frequency may be 10 Hz, and the frequency of the control cycle may be 1 kHz. The stiffness of the Theta-axis may be reduced by choosing materials with a smaller Young's modulus or through structural design choices. By way of example and not by way of limitation, the vibrational frequency of the Theta-axis may be lowered by decreasing the stiffness of the gear and the coupling which produce motion about the Theta-axis.

FIG. 6A is an overhead view of an end effector 612 moving a substrate 610 to a chuck 615. The support structure 611 is attached to a Theta-axis with high stiffness. The high stiffness about the Theta-axis generates a high vibrational frequency 656. The vibrational frequency 656 in the Theta-axis generates a displacement 655 at the end of the end effector. The displacement 655 is greatly exaggerated to demonstrate how it diminishes the repeatability. FIG. 6B is another overhead view of an end effector 612 moving a substrate to a chuck 615. However, in FIG. 6B the support structure 611 is attached to a Theta-axis with a reduced stiffness. Due to the decrease in stiffness, the vibrational frequency 656 about the Theta-axis is reduced and the frequency of the displacement 655 at the tip of the end effector 612 is therefore reduced as well.

Without being tied to any theory of operation the improvement in repeatability as result of the relationship between the control cycle frequency and the vibration frequency may be explained as follows.

The controller 206 may be configured to check the position of the axis by checking the encoder position with respect to a theoretical motion profile. If there is a deviation between the encoder position and the position as determined by the theoretical motion profile the controller corrects for it, e.g., by increasing or decreasing current. The faster the checking and correction is done the smaller the deviation. The smaller the deviation is the closer the actual motion profile is to the theoretical motion profile. The closer the actual motion profile is to the theoretical motion profile the better the repeatability will be because the wafer meets the chuck at a repeatable position in x, y and z.

When the vibrational frequency 655 of the apparatus is decreased there is often an increase in the amplitude of the vibrations. Therefore, it may be desirable to choose materials which will dampen the vibrational motion. Specifically, proper material selection for the end effector support structure 611 and the end effector 612 can reduce the amplitude of the vibrational motion. In some aspects of the present disclosure, the two components may be made from the same material. By way of example, and not by way of limitation both the support structure 611 and the end effector 612 may be made from a composite material such as, but not limited to carbon fiber. Additionally, the damping may be increased through selection of a fiber orientation of the composite mater that minimizes vibration in a certain desired direction.

In additional aspects of the present disclosure, the two components may be made from different materials. By way of example, and not by way of limitation, the support structure 611 may be made from a composite material, such as carbon fiber. By way of example, and not by way of limitation, the end effector 612 may be made from a ceramic material such as, but not limited to alumina. It is important to note, that materials chosen for either component should also not outgas if used in a cleanroom environment.

Figure 7:
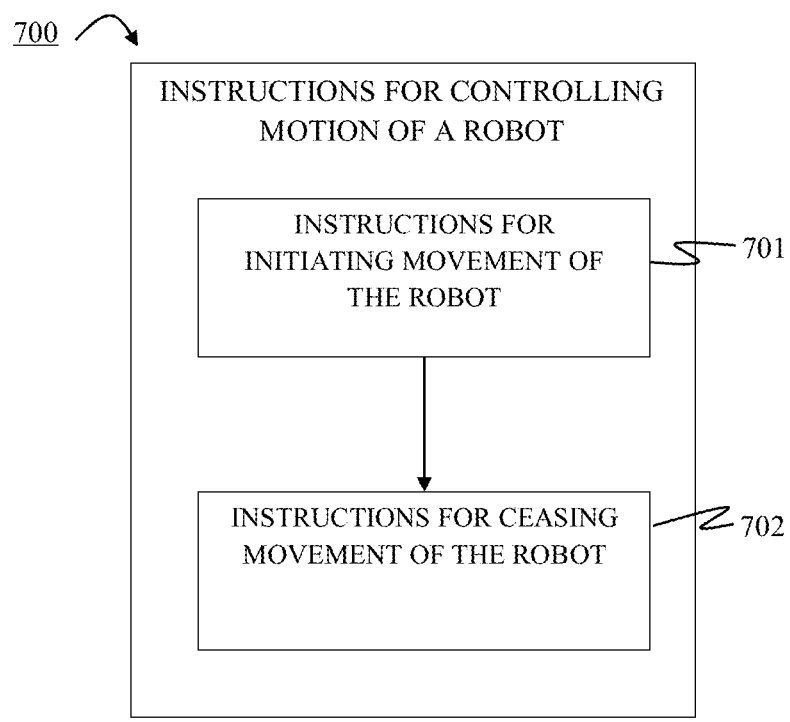
FIG. 7 is a block diagram of instructions for moving a substrate transporter according to an aspect of the present disclosure.

As shown in FIG. 7, a set of controller instructions 700 may be implemented, e.g., by the controller 206. The controller instructions 700 may be formed on a nontransitory computer readable medium such as the memory 132 or the mass storage device 134. The controller instructions 700 may also be part of the process control program 133. At 701, the controller may initiate the movement of the robot. Thereafter, at 702 the controller may be instructed to cease the motion of the robot.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A robot comprising:
   a controller;
   one or more actuators, wherein the movement of the one or more actuators is initiated and ceased by the controller;
   one or more encoders configured to track the position of the one or more actuators and further configured to deliver the position of the one or more actuators to the controller; and
   one or more mechanical components configured to transform the movement of the one or more actuators into a desired movement of the robot, wherein at least one of the mechanical components is an end effector, and wherein a frequency of a control cycle of the controller is 50 times or more greater than a known vibrational frequency of a vibrational motion of the end effector or one or more mechanical components during the desired movement of the robot, wherein the control cycle includes comparing an encoder position determined from one or more of the encoders to a theoretical position as determined by a theoretical motion profile and applying a signal to a corresponding one or more of the actuators with the controller to correct for a deviation between the encoder position and the theoretical position.

2. The robot of claim 1, wherein the desired movement of the robot is to transport a substrate from a first position to a second position.

3. The robot of claim 1, wherein the desired movement of the robot is capable of being produced along an X-axis, a Z-axis, an R-axis, and a theta-axis.

4. The robot of claim 3, wherein the frequency of a control cycle of the controller is 50 times or more greater than a known vibrational frequency of a vibrational motion of the one or more mechanical components with respect to the theta axis during the desired movement of the robot.

5. The robot of claim 3, wherein a first mechanical component is a linear slide configured to transform a first actuator's movement in to a desired movement of the robot along the X-axis; wherein a second mechanical component is a linear slide configured to transform a second actuator's movement into a desired movement of the robot along the Z-axis; wherein a third mechanical component is a linear slide configured to transform a third actuator's movement into a desired movement of the robot along the R-axis; and wherein a fourth mechanical component is a support oriented along the Z-axis and configured to transform a fourth actuator's movement into a desired movement of the robot about the theta-axis, wherein a fixed mechanical support supports the first, second, and third mechanical components.

6. The robot of claim 5, wherein each of the one or more mechanical components are substantially sealed by an enclosure, and wherein the enclosure comprises one or more slots along the length of the X-axis and the R-axis configured to allow the one or more mechanical components to extend outside of the enclosure and move in a linear path along the length of the slot.

7. The robot of claim 6, wherein each of the one or more slots includes one or more baffles configured to prevent particulates generated during the movement of the one or more mechanical components from passing through the one or more slots.

8. The robot of claim 7, wherein an air pressure within the enclosure is lower than an air pressure outside of the enclosure.

9. The robot of claim 5, further comprising a fifth mechanical component, wherein the fifth mechanical component is a linear slide configured to transform a fifth actuator's movement into a desired movement of the robot along the R-axis, wherein the fourth mechanical component supports the fifth mechanical component.

10. The robot of claim 9, wherein the movement of the fifth mechanical component is offset from the movement of the third mechanical component along the Z-axis.

11. The robot of claim 10, wherein the fifth mechanical component and the third mechanical component are end effectors.

12. The robot of claim 11, wherein each end effector includes an actuator, two stoppers and a frame, wherein the actuator and the two stoppers are configured to support a substrate along a circumferential edge of the substrate such that a bottom surface of the substrate remains spaced away from the frame.

13. The robot of claim 12, wherein the actuator is configured to supply pressure to the circumferential edge of the substrate such that the substrate is pinched against the two grips.

14. The robot of claim 12, wherein the two stoppers are separate mechanical components that are attached to the frame.

15. The robot of claim 14, wherein the two stoppers are a polymer material.

16. The robot of claim 12, wherein the two stoppers and the frame are formed as a single component.

17. The robot of claim 12, wherein each end effector further includes one or more support pads configured to support the bottom surface of the substrate proximate to the circumferential edge of the substrate.

18. The robot of claim 17, wherein the one or more support pads are separate mechanical components that are attached to the frame.

19. The robot of claim 18, wherein the one or more support pads are a polymer material.

20. The robot of claim 17, wherein the one or more support pads and the frame are formed as a single component.

21. The robot of claim 1, wherein the end effector is attached to a support structure.

22. The robot of claim 21, wherein the end effector and the support structure are formed from the same material.

23. The robot of claim 22, wherein the material is a composite material.

24. The robot of claim 21, wherein the end effector and the support structure are formed from different materials.

25. The robot of claim 24, wherein the end effector is formed from a ceramic material, and wherein the support structure is formed from a composite material.

26. In a robot comprising a controller, one or more actuators configured to be activated by the controller, one or more encoders configured to track the position of the one or more actuators, and one or more mechanical components configured to transform the movement of the one or more actuators into a desired movement of the robot, wherein a frequency of a control cycle of the controller is 50 times or more greater than a known vibrational frequency of a vibrational motion of the one or more mechanical components during the desired movement of the robot, a method of producing the desired movement of the robot comprising:

a) initiating the desired movement of the robot with the controller; and b) ceasing the desired movement of the robot with the controller, wherein the control cycle includes comparing an encoder position determined from one or more of the encoders to a theoretical position as determined by a theoretical motion profile and applying a signal to a corresponding one or more of the actuators with the controller to correct for a deviation between the encoder position and the theoretical position.

27. A nontransitory computer readable medium containing program instructions for producing the desired movement of a robot, wherein the robot comprises a controller, one or more actuators configured to be activated by the controller, one or more encoders configured to track the position of the one or more actuators, and one or more mechanical components configured to transform the movement of the one or more actuators into a desired movement of the robot, wherein a frequency of a control cycle of the controller is 50 times or more greater than a known vibrational frequency of a vibrational motion of the one or more mechanical components during the desired movement of the robot and wherein execution of the program instructions by one or more processors of a computer system causes the one or more processors to carry out the steps of:

a) initiating the desired movement of the robot with the controller; and b) ceasing the desired movement of the with the controller, wherein the control cycle includes comparing an encoder position determined from one or more of the encoders to a theoretical position as determined by a theoretical motion profile and applying a signal to a corresponding one or more of the actuators with the controller to correct for a deviation between the encoder position and the theoretical position.

\* \* \* \* \*